United States Patent [19]
Azzaro et al.

[11] Patent Number: 5,565,262
[45] Date of Patent: Oct. 15, 1996

[54] ELECTRICAL FEEDTHROUGHS FOR CERAMIC CIRCUIT BOARD SUPPORT SUBSTRATES

[75] Inventors: Thomas P. Azzaro, Burlington; Barry J. Thaler, Lawrenceville; Edward J. Conlon, Princeton; Ananda H. Kumar, Plainsboro, all of N.J.

[73] Assignee: David Sarnoff Research Center, Inc., Princeton, N.J.

[21] Appl. No.: 379,264

[22] Filed: Jan. 27, 1995

[51] Int. Cl.$^6$ ........................................................ B32B 9/00
[52] U.S. Cl. ........................ 428/210; 428/432; 428/433; 428/901; 428/209; 174/256; 174/261
[58] Field of Search ........................................ 428/209, 901, 428/432, 433, 210; 174/256, 261

[56] References Cited

U.S. PATENT DOCUMENTS

| | | | |
|---|---|---|---|
| 4,563,543 | 1/1986 | Kersuzan et al. | 428/901 |
| 4,795,670 | 1/1989 | Nishigaki et al. | 428/209 |
| 5,004,640 | 4/1991 | Nakatani et al. | 428/209 |
| 5,021,287 | 6/1991 | Otagiri et al. | 428/209 |
| 5,232,765 | 8/1993 | Yano et al. | 428/901 |
| 5,277,724 | 1/1994 | Prabhu | 156/89 |

*Primary Examiner*—Patrick Ryan
*Assistant Examiner*—Cathy K. Cam
*Attorney, Agent, or Firm*—William J. Burke

[57] ABSTRACT

Electrical feedthroughs in printed circuit board support substrates for use in making double sided ceramic multilayer printed circuit boards are made by insulating the feedthrough openings with a first layer of nickel oxide and one or more layers of glass, and then filling the remainder of the feedthroughs with a conductive metal via fill ink. After firing, the resultant structure provides insulated electrical feedthroughs through the support substrate.

16 Claims, 2 Drawing Sheets

ELECTRICAL FEEDTHROUGHS FOR CERAMIC CIRCUIT BOARD SUPPORT SUBSTRATES

This invention was made with Government support under DAAB07-94-C-C009 awarded by the US Department of the Army. The Government has certain rights in this invention.

This invention relates to a method of making electrical feedthroughs in thermally conductive support substrates used to impart mechanical strength to ceramic multilayer printed circuit boards. More particularly, this invention relates to a method of making electrical feedthroughs in ceramic multilayer printed circuit board support substrates that is compatible with mass production techniques.

BACKGROUND OF THE INVENTION

Ceramic multilayer printed circuit boards have been used for many years for circuits for electrical apparatus, such as mainframe computers. Such printed circuit boards are made by casting glass and/or ceramic powders together with an organic binder into tapes, called green tapes. A metal circuit can be patterned onto the green tape by screen printing for example. Vias are formed in each green tape layer that are filled with a conductive material to connect the circuits of the various layers electrically. The green tape layers are then aligned and stacked, pressed together, and fired to burn off organic residues and sinter the glass, thereby forming a fired ceramic multilayer circuit board.

Originally ceramics such as alumina were used to form the green tape layers, but these ceramics require high firing temperatures, up to 1500° C. This necessitated the use of refractory conductive metals, such as tungsten or molybdenum, to form the conductive circuit patterns because such metals could withstand high firing temperatures without melting. More recently, lower temperature materials have been used, such as devitrifying glasses that can be fired at lower temperatures of 1000° C. or less. Multilayer circuit boards made of these glass or glass-ceramic materials can be used with lower melting point and higher conductivity metals, such as silver, gold or copper. However, these printed circuit boards have the disadvantage that they are not as strong as alumina circuit boards.

Thus still more recently, low firing temperature glasses have been deposited on support substrates made of metal or ceramic to which the glasses will adhere. The support substrate can be of a thermally conductive material such as nickel, kovar, a ferrous/nickel/cobalt/manganese alloy, Invar®, a ferronickel alloy, low carbon steel, or Cu/kovar, a ferrous/nickel/cobalt/manganese alloy/Cu, Cu/Mo/Cu or Cu/Invar/Cu composites and the like, as well as thermally conductive ceramics such as aluminum nitride, silicon carbide, diamond and the like. These substrates impart added strength to the composite. A bonding glass, such as described in U.S. Pat. No. 5,277,724 to Prabhu, adheres the ceramic substrate formed from the green tape layers to the substrate. In addition, if chosen correctly, the bonding glass can reduce shrinkage of the green tape with respect to the metal substrate in at least the two lateral dimensions. Thus all of the shrinkage occurs in the thickness dimension only. This in turn reduces problems of alignment of the circuit patterns in the ceramic layers and the via holes in the metal substrate after firing.

However, when it is desired to produce glass/ceramic multilayer ceramic circuit boards on both sides of the support substrate, the presence of the thermally and electrically conductive metal or ceramic core material between two circuit boards can cause short circuits. Thus the multilayer circuits on one side of the support substrate have been connected to the multilayer circuits on the other side of the support substrate by means of circuit traces or lines that extend around the periphery of the circuit board rather than through the support substrate. However, such peripheral traces are subject to damage or breakage during handling and assembly of the circuit boards into a module, for example, and in some cases the traces would have to be too long for an acceptable design. Such designs also increase wiring lengths and decrease interconnection density. Thus an improved method of permitting electrical connection between two ceramic multilayer circuit boards on both sides of a support substrate would be highly desirable.

SUMMARY OF THE INVENTION

The present process for forming electrical feedthroughs in support substrates for double sided printed circuit board substrates comprises providing dielectric insulation in the feedthroughs. Typically a via hole is opened in the support substrate core material, as by drilling, the substrate via hole is plated with nickel, one or more dielectric materials such as glass is deposited in the via hole. Lastly a conductive metal is deposited to fill the via hole inside the dielectric ring. The dielectric material and the center conductive metal must be able to withstand several firings at temperatures up to at least 900° C. without melting or flowing.

DETAILED DESCRIPTION OF THE INVENTION

The preferred support substrate for use herein is a Cu/Mo/Cu metal composite substrate commercially available from the Climax Metals Company, although other materials can be substituted, as described hereinabove.

Figure 1:
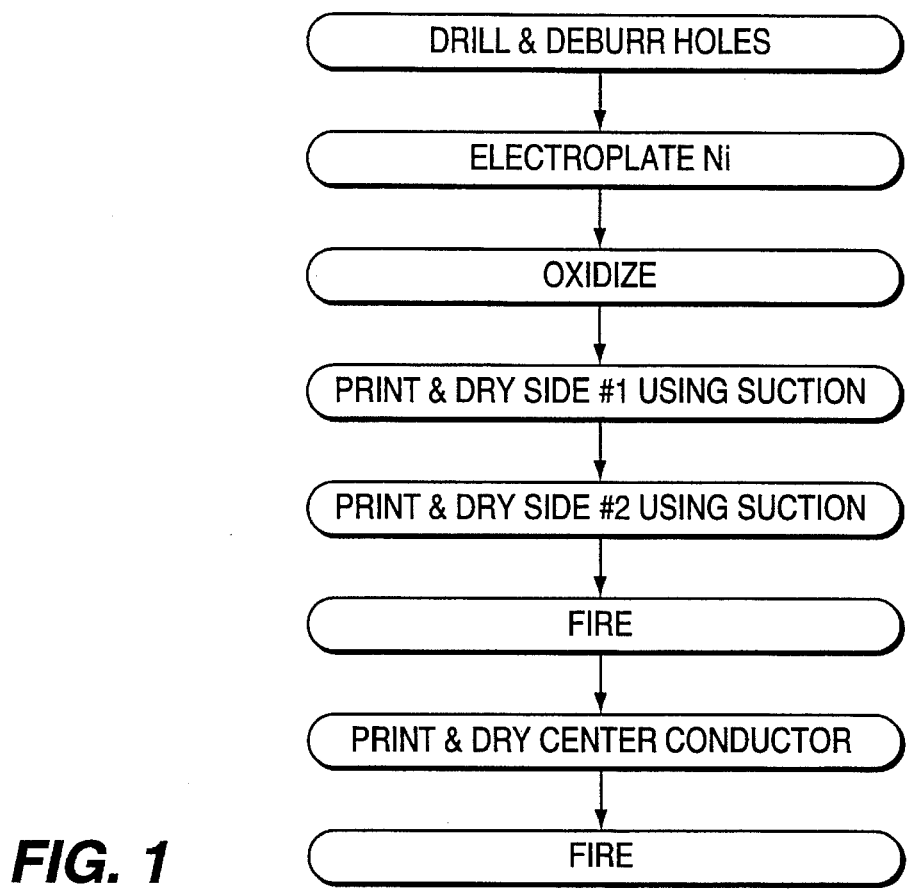
FIG. 1 is a flow chart of the preferred process for filling via holes in a printed circuit board support substrate in accordance with the process of the invention.

Referring to FIG. 1, which is a flow chart of a suitable process for making the electrical feedthroughs in a printed circuit board support substrate in accordance with the invention, in a first step of the present process, via openings can be formed in the support substrate using a laser or mechanical drilling equipment that can drill small diameter holes, e.g., about 13–40 mils in diameter or less. The mechanically drilled openings are then deburred, as by rubbing the edges with a soft stone, whereby via openings having sharp corners are eliminated. The thicker the substrate material, the more difficulty may be encountered in drilling the openings. Thirteen mil diameter holes can also be readily drilled using a Nd:YAG laser at 15–30 watts with 0.6 msec pulse lengths. A minimum hole diameter of 7 mils for a 20 mil thick support substrate can be made readily. If the thickness of the support substrate is higher, the minimum hole diameter that can be made may be larger; for example, for a 40 mil thick support substrate, the minimum hole diameter that can be readily made is 8 mils.

The drilled holes are next deburred and nickel plated. This step seals the core material of the support substrate and can be accomplished by conventional nickel electroplating methods. The nickel is then oxidized, as by heating in air at temperatures about 820° C. The nickel oxide layer, which exhibits a resistance of $10^8$–$10^9$ ohms, constitutes the first ring of dielectric material in the via hole.

An insulating dielectric layer, as of a glass, is then deposited in the via hole to form an annular ring. Since glass is a fragile material that can crack during multiple firings, it is preferred that two or more layers of glass be sequentially deposited in the openings so that if a defect, such as a pore, forms in one layer, it will not extend through the entire glass layer, to cause a shorted feedthrough.

The glasses suitable for use in the present invention, using Cu/Mo/Cu metal composite substrates, must have a thermal coefficient of expansion matched to the Cu/Mo/Cu substrate; must have good adhesion to nickel oxide, must be able to wet nickel oxide; and must be able to be fired at temperatures required to form the desired ceramic multilayer circuit board.

One particular glass composition having the following composition in percent by weight is particularly useful with the above nickel plated Cu/Mo/Cu composite metal substrate;

| | |
|---|---|
| ZnO | 28.68 |
| MgO | 5.92 |
| BaO | 6.21 |
| $Al_2O_3$ | 15.36 |
| $SiO_2$ | 43.82 |

Figure 2:
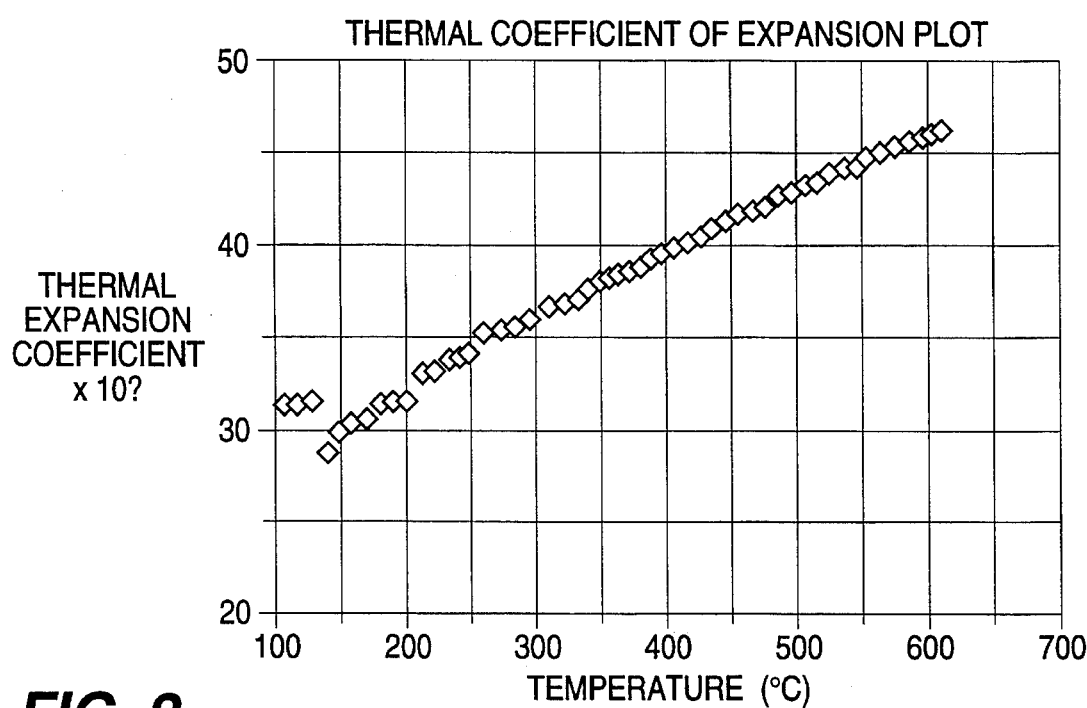
FIG. 2 is a thermal coefficient of expansion plot of a glass suitable for use as a dielectric in the present process.
Figure 3:
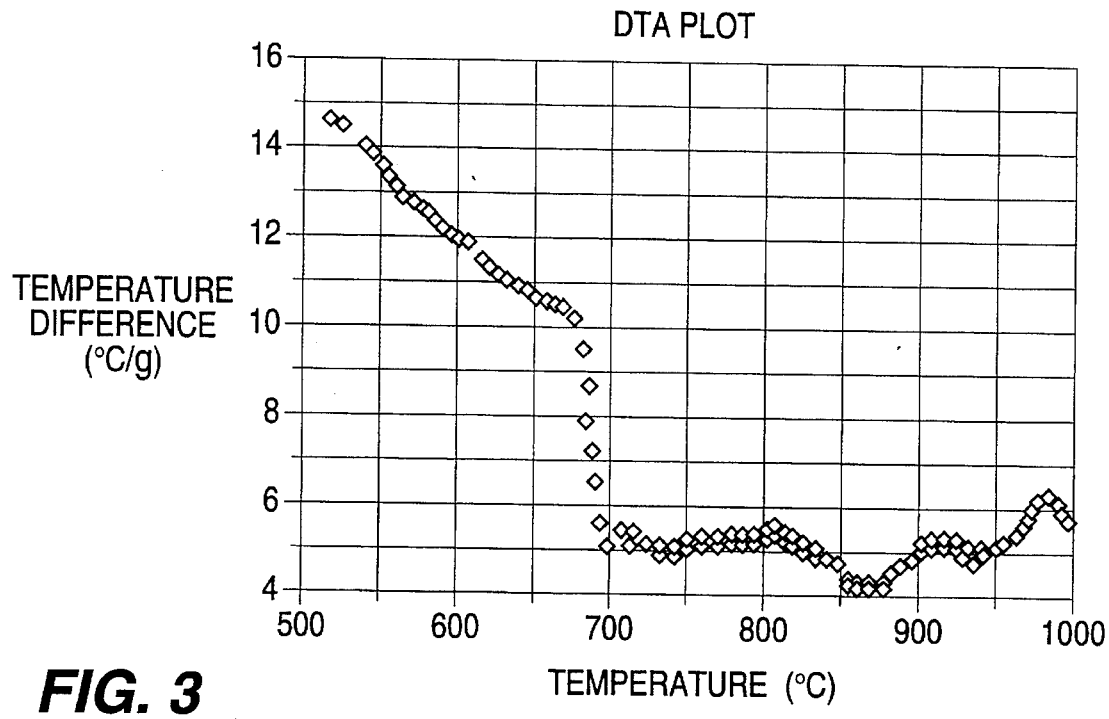
FIG. 3 is a differential thermal analysis (DTA) plot of a glass suitable for use as a dielectric in the present process.

This glass has a thermal coefficient of expansion plot as shown in FIG. 2 and a DTA plot as shown in FIG. 3. This glass can be used as the dielectric insulator for the substrate via holes. The same glass can also be used later in the process as a constituent of the thick film conductor via fill ink required for filling the center of each via hole with conductive metal, as further described below.

Another suitable glass composition for use with the preferred metal substrate has the following composition in percent by weight:

| | |
|---|---|
| MgO | 29.0 |
| $Al_2O_3$ | 22.0 |
| $SiO_2$ | 45.0 |
| $P_2O_5$ | 1.5 |
| $B_2O_3$ | 1.0 |
| $ZrO_2$ | 1.5 |

A preferred method of applying the glass composition from a standard glazing ink constituting the above glass is to apply vacuum after the screen printing to deposit one or more of the above glass layers. Such a glazing ink comprises the finely divided glass and an organic vehicle. Suitable organic vehicles are solutions of resin binders, such as cellulose derivatives, synthetic resins such as polyacrylates, polymethacrylates, polyesters, polyolefins and the like, in a suitable solvent. The solvent can be pine oil, terpineol, butyl carbitol acetate, 2,2,4-trimethyl-1,3-pentanediol monoisobutyrate and the like. The vehicles generally contain from about 5 to 25 percent by weight of the resin binder.

Figure 4A:
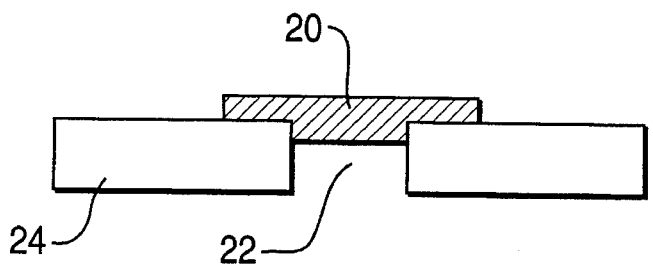
FIGS. 4A and 4B illustrate the steps of forming a glass dielectric layer in a via hole.
Figure 4B:
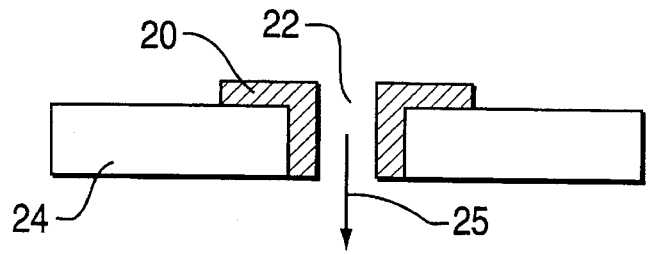

FIG. 4A illustrates a printed glass layer 20 over a via hole 22 in a metal substrate 24.

A vacuum is applied after the printing, beneath the metal substrate 24 in the direction of the arrow 25, sufficient to bring the glass ink layer 20 into the via hole 22, thereby forming an annular ring of the glass ink inside the via hole 22. This glass layer is then dried. The deposition and vacuum pull can be repeated to form multiple glass dielectric layers in the via hole 22. If both sides of the metal substrate 24 are to be used, the above sequence of steps is repeated on the opposite side of the metal substrate 24.

The support substrate is then fired to sinter the glass powder and form a composite fired glass insulator layer in the opening.

A thick via fill ink containing a conductive metal powder is then applied to the metal substrate, also using conventional screen printing techniques. For example, a suitable conductor thick film ink comprises a mixture of silver or other conductive metal powder, glass, and an organic vehicle as described above in proportions so as to form a print screenable thick film paste.

Thick film conductor via fill inks are made by mixing a finely divided conductive metal powder, with a preselected glass powder and an organic vehicle. Suitable conductive powders include silver, gold, copper, their mixtures, and alloys thereof with palladium and platinum and the like, or nickel. The fired thick film conductive metal ink can comprise from about 50–90% by weight of metal and about 10–50% by weight of a glass.

The thick film conductor via fill ink composition is applied to the prepared printed circuit board support substrate so as to fill the glass insulated via holes and is then fired to remove organic materials and to sinter the metal powder to obtain the conductive, insulated feedthroughs.

Figure 5:
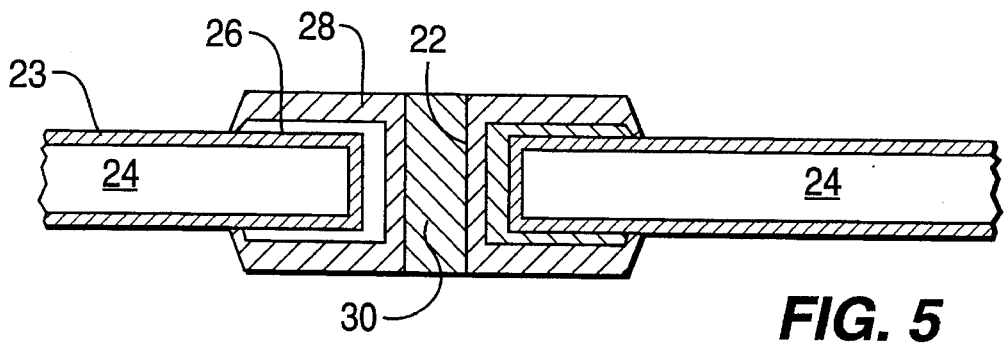
FIG. 5 is a cross sectional partial view of a printed circuit board support substrate having a filled via hole filled in accordance with the method of the invention.

FIG. 5 is a cross sectional view of the metal substrate 24 having dielectric insulated electrical feedthroughs therein. The via hole 22 in the metal substrate 24 has a first layer 23 of nickel oxide dielectric, two dielectric glass layers 26, 28 and a conductive via fill layer 30 therein. Sufficient conductive via fill ink is applied so that the remainder of the via hole 22 is completely filled at the end of the process.

The support substrate as prepared above, having conductive vias in via openings that are dielectrically insulated from the rest of the substrate, can then be used to prepare double sided multilayer printed circuit boards from the substrates of the invention in conventional manner.

The above process can be used to make a reproducible support substrate having a plurality of electrical feedthroughs therein that will not form short circuits between circuitry on both sides of the substrate. The support substrate having electrical feedthroughs as prepared above can withstand several firings at temperatures used in making ceramic multilayer printed circuit boards without undermining the structural and electrical integrity of the feedthroughs.

Although the present process and electrical feedthroughs have been described in terms of specific embodiments, one skilled in the art can readily substitute other materials and reaction conditions for the glass layers and conductors described hereinabove. Thus the scope of the present invention is only meant to be limited by the appended claims.

We claim:

1. A fired printed circuit board support substrate having a via hole containing the following sequential layers therein:

a nickel oxide first dielectric layer adjacent to the walls of said via hole;

one or more glass dielectric layers inside and adjacent to said nickel oxide layer; and a conductive material comprising a mixture of conductive metal and of a glass that fills the via.

2. A substrate according to claim 1 wherein said support substrate comprises a nickel plated composite of a metal selected from the group consisting of molybdenum, a ferronickel and a ferrous/nickel/cobalt/manganese alloy.

3. A substrate according to claim 2 wherein said substrate comprises a member of the group consisting of a ferronickel and a ferrous/nickel/cobalt/manganese alloy.

4. A substrate according to claim 1 wherein said conductive metal is silver.

5. A substrate according to claim 1 wherein said conductive metal is selected from the group consisting of copper and gold.

6. A substrate according to claim 1 wherein said glass dielectric layer has a thermal coefficient of expansion matched to of the support substrate material, will wet nickel oxide and can be fired at a temperature up to about 1000° C.

7. A substrate according to claim 6 wherein said glass comprises zinc oxide, 28.68% by weight, magnesium oxide, 5.92% by weight, barium oxide, 6.21% by weight, aluminum oxide, 15.36% by weight and silicon oxide, 43.82% by weight.

8. A substrate according to claim 6 wherein said glass comprises magnesium oxide, 29% by weight, aluminum oxide, 22% by weight, silicon oxide, 45% by weight and up to 5% by weight of oxides of phosphorus, boron and zirconium.

9. A substrate according to claim 1 wherein said substrate is a nickel plated Cu/Mo/Cu composite and said glass has a thermal coefficient of expansion matched to the substrate.

10. A substrate according to claim 1 wherein said glass is a magnesium aluminosilicate glass having a thermal coefficient of expansion of about $40-55 \times 10^{-7}$/°C.

11. A fired printed circuit board thermally conductive support substrate having a conductive via that is dielectrically isolated from the support substrate.

12. A support substrate according to claim 11 wherein the dielectric isolation is provided by a glass layer in the via.

13. A support substrate according to claim 12 wherein the support substrate is a conductive metal selected from the group consisting of a ferronickel, a ferrous/nickel/cobalt/manganese alloy and molybdenum and composites of copper clad conductive metals.

14. A support substrate according to claim 13 wherein the glass layer is selected from the group consisting of a glass having a coefficient of expansion matched to the conductive metal substrate.

15. A support substrate according to claim 14 wherein said glass has the composition zinc oxide, 28.68% by weight, magnesium oxide, 5.92% by weight, barium oxide, 6.21% by weight, aluminum oxide, 15.36 & by weight, and silicon oxide, 43.82% by weight.

16. A support substrate according to claim 14 wherein said glass has the composition magnesium oxide, 29% by weight; aluminum oxide, 22% by weight, silicon oxide 45% by weight and up to 4% by weight of phosphorus oxide, boron oxide and zirconium oxide.

\* \* \* \* \*